(12) United States Patent
Kim et al.

(10) Patent No.: US 7,106,653 B2
(45) Date of Patent: Sep. 12, 2006

(54) SEMICONDUCTOR MEMORY DEVICE AND DATA READ METHOD OF THE SAME

(75) Inventors: Myeong-O Kim, Gyeonggi-do (KR); Sung-Min Seo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 104 days.

(21) Appl. No.: 10/993,577

(22) Filed: Nov. 19, 2004

(65) Prior Publication Data
US 2005/0122830 A1  Jun. 9, 2005

(30) Foreign Application Priority Data
Dec. 8, 2003  (KR)  .................... 10-2003-0088708

(51) Int. Cl.
*G11C 8/00* (2006.01)
(52) U.S. Cl. .................. 365/233; 365/194; 365/189.07
(58) Field of Classification Search ................ 365/233, 365/194, 189.07, 185.2, 185.22
See application file for complete search history.

(56) References Cited

U.S. PATENT DOCUMENTS 5,990,730 A * 11/1999 Shinozaki .................... 327/544
2005/0195663 A1* 9/2005 Kwak .......................... 365/194

FOREIGN PATENT DOCUMENTS

| JP | 2002-304885 | 10/2002 |
| KR | 1999-48159 | 7/1999 |
| KR | 1999-86847 | 12/1999 |

OTHER PUBLICATIONS

English language abstract of Korean Publication No. 1999-86847.
English language abstract of Korean Publication No. 1999-48159.
English language abstract of Japanese Publication No. 2002-304885.

* cited by examiner

*Primary Examiner*—Richard Elms
*Assistant Examiner*—Dang Nguyen
(74) *Attorney, Agent, or Firm*—Marger Johnson & McCollom, P.C.

(57) ABSTRACT

The present invention discloses a semiconductor memory device that includes first and second memory banks. A first control signal generating circuit generates a first control signal responsive to an external clock. A first data output circuit transmits a first output data responsive to the first control signal. An internal clock signal generating circuit outputs first and second buffered clock signals responsive to the external clock. A second control signal generating circuit generates a second control signal responsive to the first buffered clock signal and the first control signal. A second data output circuit transmits a second output data responsive to the second control signal. A third data output circuit transmits a third output data responsive to the first and second buffered clock signals. The present invention prevents data read errors resulting from variations in power supply voltage and temperature.

15 Claims, 10 Drawing Sheets

SEMICONDUCTOR MEMORY DEVICE AND DATA READ METHOD OF THE SAME

CROSS-REFERENCE TO RELATED APPLICATION

This application claims priority from Korean Patent Application No. 2004-88708, filed Dec. 8, 2004, the disclosure of which is incorporated by reference.

BACKGROUND OF THE INVENTION

1. Field of the Invention

The present invention relates to a semiconductor memory device and, more particularly, to a double data rate (DDR) semiconductor memory device and a data read method of the same.

2. Description of the Related Art

A conventional double data rate (DDR) semiconductor memory device includes a first circuit that latches and outputs data from a memory cell array responsive to a first control signal and a second circuit that latches and outputs data from the first circuit responsive to a second control signal. The first control signal is generated responsive to an external clock signal. The second control signal is generated responsive to a buffered clock signal that is generated from an internal clock signal generating circuit.

As with all power supplies, the power supply of the DDR semiconductor memory device has a range of possible voltage outputs. It may be at its normal, nominal, value. Or depending on other conditions may drop slightly below its nominal value, to a low power supply voltage. Or the output voltage may drop slightly above its nominal value, to a high power supply voltage. Similarly, the temperature of the DDR semiconductor memory is not constant and may move through a range. This variation in power supply voltage and circuit temperature effects the operation of the memory device. For example, a column selecting signal and the first control signal, which are dependant on an externally-applied clock signal, are advanced at high power supply voltage and low temperature. On the other hand, the buffered clock signal and the second control signal, which are dependant on an internal clock signal, are delayed at high power supply voltage and low temperature.

This is because the internal clock signal generating circuit includes a delay locked loop (DLL) or a phase locked loop (PLL) and is designed such that these circuits either advance or delay the buffered clock signal according to variations of power supply voltage and temperature so that data can be outputted at an exact time. That is, compared to normal operation, the internal clock signal generating circuit operates to delay the buffered clock signal at high power supply voltage and low temperature which can advance the first control signal. On the other hand, at low power supply voltage and high temperature the internal clock signal generating circuit operates to advance the buffered clock signal which can delay the first control signal.

However, a problem is created at high power supply voltage and low temperature in that the first control signal is advanced and the second control signal is delayed. This causes the first and second control signals to overlap, leading to data read errors.

Figure 1:
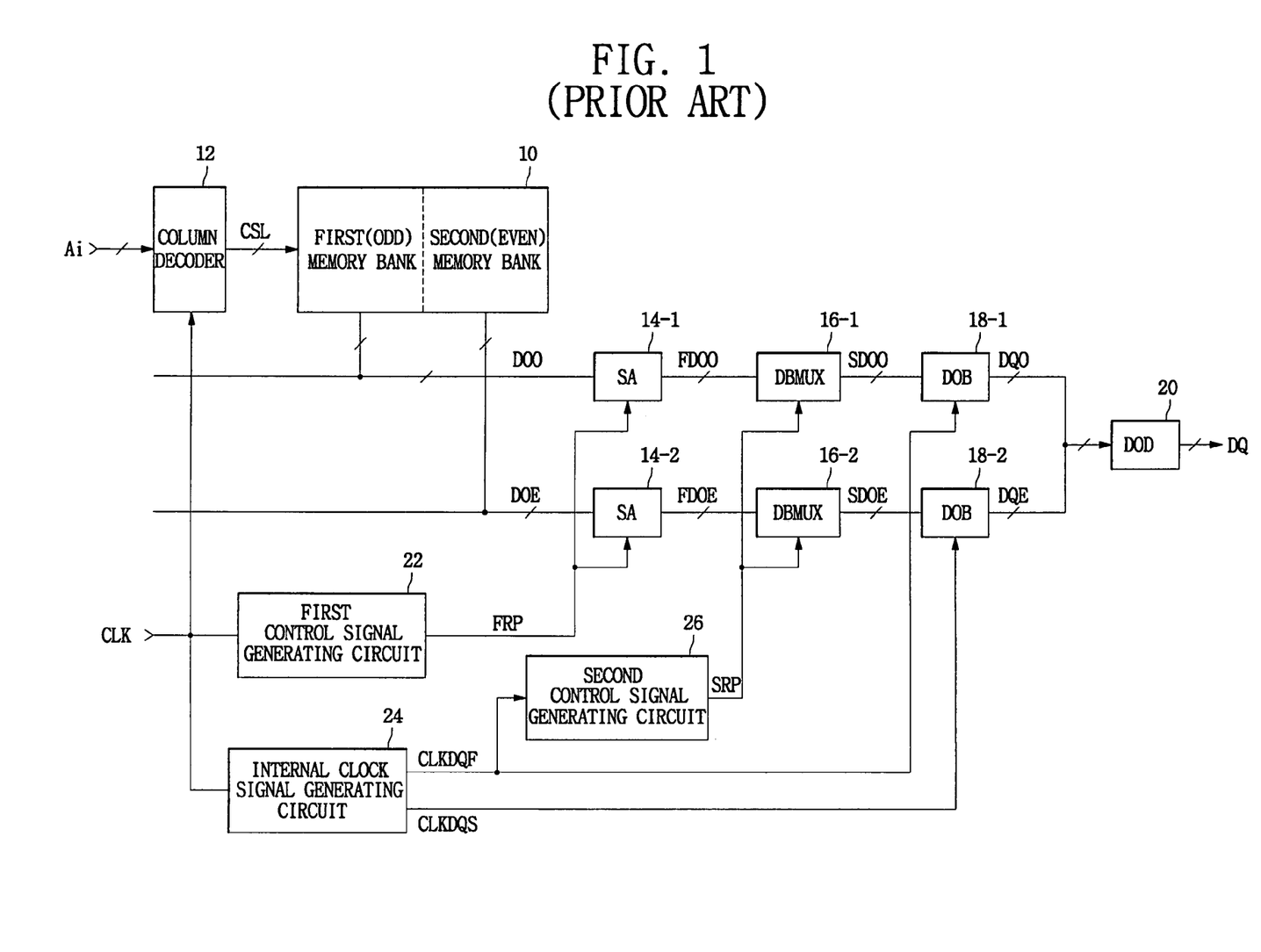
FIG. 1 is a block diagram of a conventional DDR semiconductor memory device.

FIG. 1 is a block diagram illustrating a conventional DDR semiconductor memory device. The DDR semiconductor memory device of FIG. 1 includes a memory cell array 10 having a first (odd) memory bank and a second (even) memory bank, a column decoder 12, sense amplifiers 14-1 and 14-2, multiplexers 16-1 and 16-2, data output buffers 18-1 and 18-2, a data output driver 20, a first control signal generating circuit 22, an internal clock signal generating circuit 24, and a second control signal generating circuit 26.

In FIG. 1, SA denotes the sense amplifiers 14-1 and 14-2, DBMUX denotes the multiplexers 16-1 and 16-2, DOB denotes the data output buffers 18-1 and 18-2, and DOD denotes the data output driver 20.

The DDR semiconductor memory device of FIG. 1 operates as follows. The first and second memory banks read data from memory cells selected by a word line (not shown) and a bit line (not shown). The first and second memory banks then output a data DOO and DOE, respectively.

A clock signal CLK is generated by buffering a clock signal applied from an external portion. The column decoder 12 decodes an address Ai applied from an external portion to generate a column selecting signal CSL responsive to the clock signal CLK. The sense amplifiers 14-1 and 14-2 amplify the data DOO and DOE to output first data FDOO and FDOE, respectively, responsive to a first control signal FRP. The multiplexers 16-1 and 16-2 latch the first data FDOO and FDOE to output a second data SDOO and SDOE, respectively, responsive to a second control signal SRP. The data output buffers 18-1 and 18-2 buffer the data SDOO and SDOE to generate data DQO and DQE, respectively, responsive to buffered clock signals CLKDQF and CLKDQS. The data output driver 20 drives the data DQO and DQE to generate an output data DQ. The first control signal generating circuit 22 generates the first control signal FRP responsive to the clock signal CLK. The internal clock signal generating circuit 24 generates the buffered clock signals CLKDQF and CLKDQS responsive to the clock signal CLK. The internal clock signal generating circuit 24 may be composed of a Delay Locked Loop (DLL) or a Phase Locked Loop (PLL). The second control signal generating circuit 26 receives the buffered clock signal CLKDQF to generate the second control signal SRP.

Figure 2:
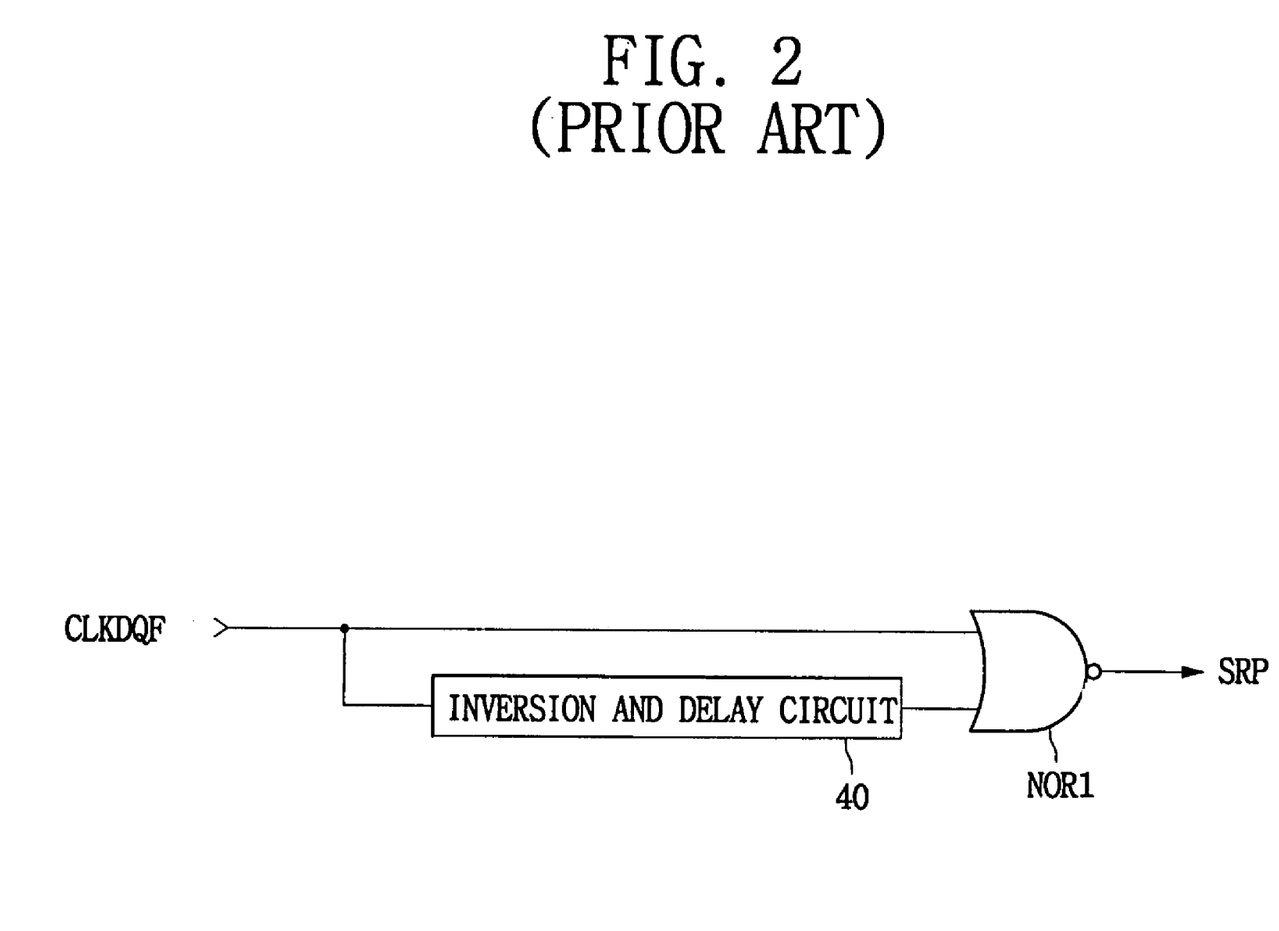
FIG. 2 is a schematic view of a second control signal generating circuit of the conventional DDR semiconductor memory device.

FIG. 2 is a schematic view of the second control signal generating circuit of the conventional DDR semiconductor memory device. The second control signal generating circuit of FIG. 2 includes an inversion and delay circuit 40 and a NOR gate NOR1.

The second control signal generating circuit of FIG. 2 operates as follows. The inversion and delay circuit 40 inverts the buffered clock signal CLKDQF and delays it for a predetermined time period. The NOR gate NOR1 NORs an output signal of the inversion and delay circuit 40 and the buffered clock signal CLKDQF to generate the second control signal SRP. The second control signal SRP has a pulse width set by the length of time the buffered clock signal CLKDQF is delayed by the invert and delay circuit 40 and is responsive to a falling transition of the buffered clock signal CLKDQF.

As shown in FIGS. 1 and 2, the conventional DDR semiconductor memory device generates the column selecting signal CSL and the first control signal FRP by using the external clock signal CLK while the second control signal SRP and the buffered clock signals CLKDQF and CLKDQS are generated by using the internal clock signal generating circuit. Thus, the column selecting signal CSL and the first control signal FRP move in opposite directions from the second control signal SRP and the buffered clock signals CLKDQF and CLKDQS based on a variation in a power supply voltage and temperature.

Figure 3:
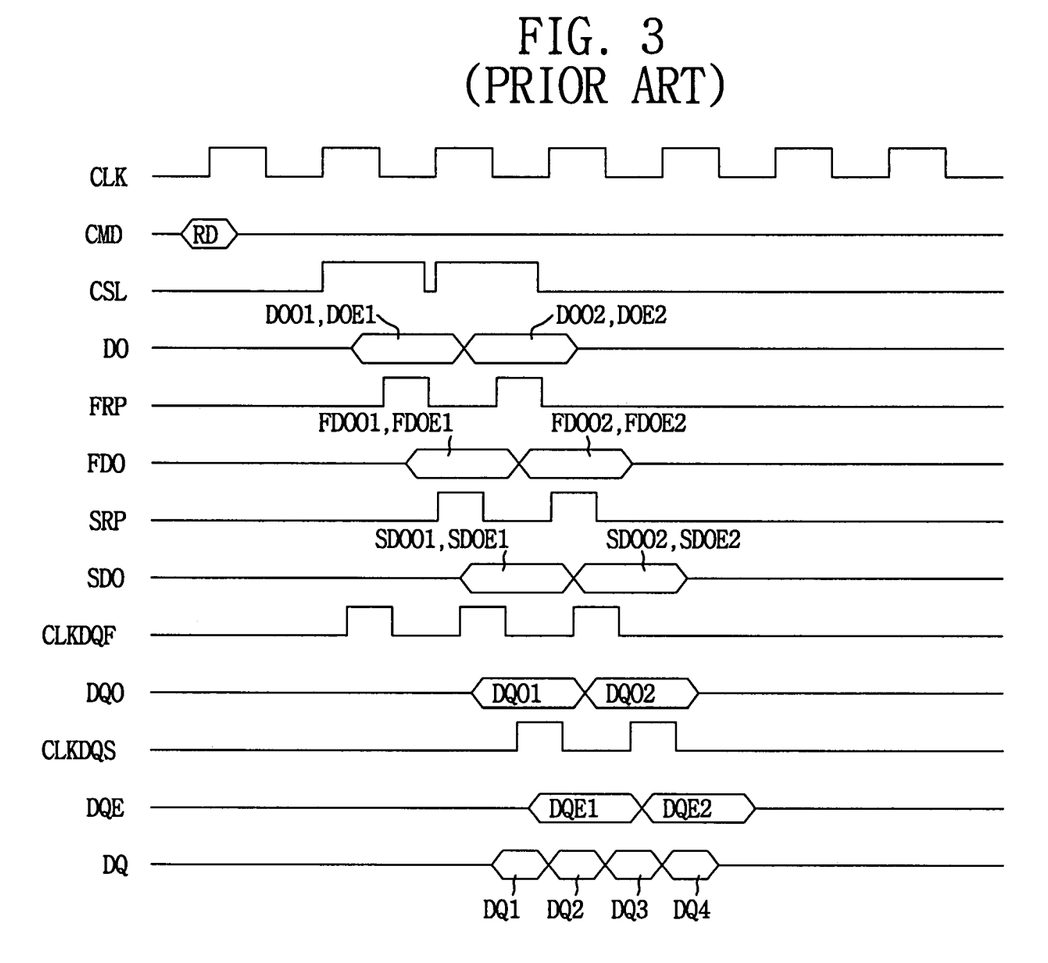
FIG. 3 is a timing diagram of a read operation of the semiconductor memory device of FIG. 1 operating under adequate power supply voltage and normal temperature conditions.

FIG. 3 is a timing diagram of a read operation of the semiconductor memory device of FIG. 1 operating with an adequate power supply voltage and at room temperature (normal operating conditions), where a read command RD is applied, and after 2.5 clock cycles data is outputted to an external portion with a burst length of 4.

When a read command RD is applied responsive to a rising edge of a clock signal CLK, the column decoder 12 generates a column selecting signal CSL responsive to the clock signal CLK. The first and second memory banks sequentially output data DOO1 and DOE1 and data DOO2 and DOE2 responsive to the column selecting signal CSL, respectively. The sense amplifiers 14-1 and 14-2 sequentially amplify the data DOO1 and DOE1 and the data DOO2 and DOE2 to sequentially output a data FDOO1 and FDOE1 and a data FDOO2 and FDOE2, respectively, responsive to a first control signal FRP. The multiplexers 16-1 and 16-2 sequentially latch the data FDOO1 and FDOE1 and the data FDOO2 and FDOE2 to sequentially generate a data SDOO1 and SDOE1 and a data SDOO2 and SDOE2, respectively, responsive to a second control signal SRP.

The data output buffers 18-1 and 18-2 sequentially buffer the data SDOO1 and SDOE1 and the data SDOO2 and SDOE2 to sequentially output a data DQO1 and DQE1 and a data DQO2 and DQE2, respectively, responsive to the buffered clock signals CLKDQF and CLKDQS. The data output driver 20 sequentially drives the data DQO1 and DQE1 and the data DQO2 and DQE2 outputted from the data output buffers 18-1 and 18-2 to generate output data DQ1 to DQ4.

Figure 4:
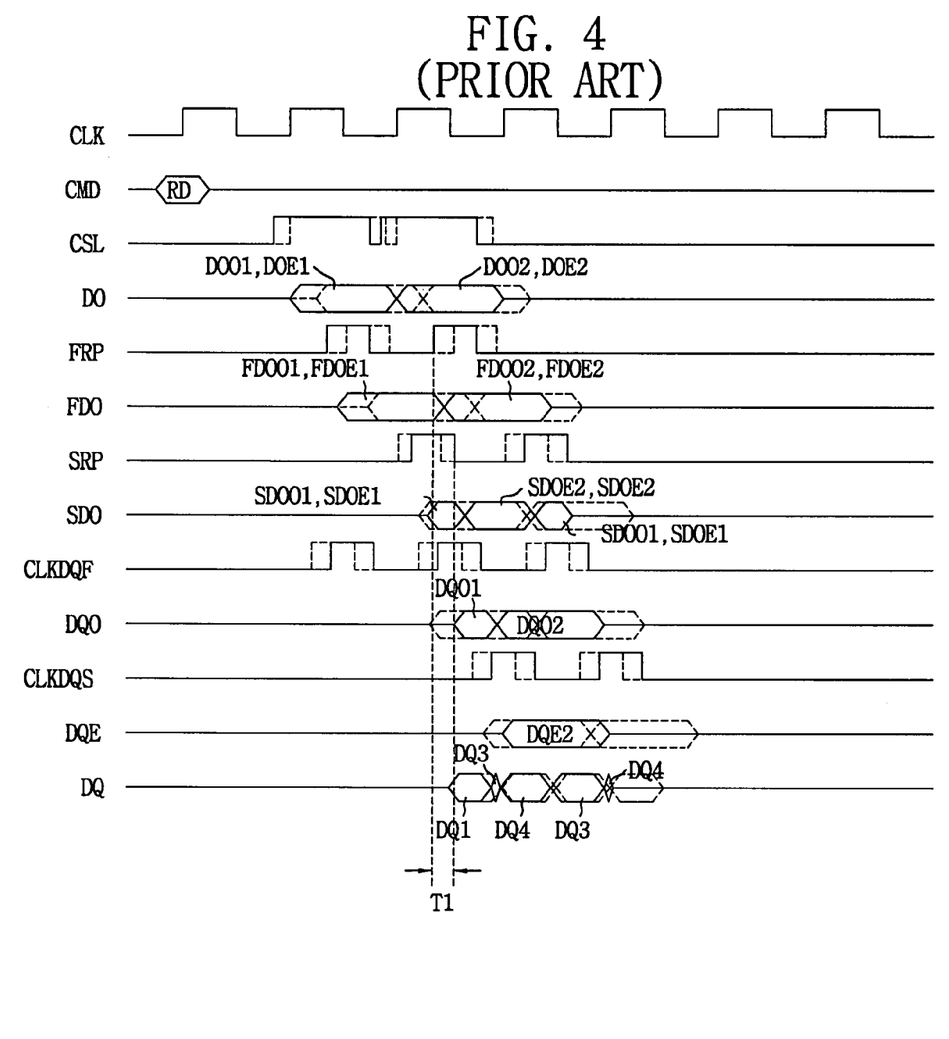
FIG. 4 is a timing diagram of a read operation of the semiconductor memory device of FIG. 1 operating under high power supply voltage and low temperature conditions.

FIG. 4 is a timing diagram illustrating a read operation of the semiconductor memory device of FIG. 1 operating under high power supply voltage and low temperature conditions. When a read command RD is applied, and after 2.5 clock cycles data is outputted to an external portion with a burst length of 4. The dotted lines of FIG. 4 denote when the signals of FIG. 3 are generated.

As shown in FIG. 4, when the semiconductor memory device operates at a high power supply voltage and low temperature, the column selecting signal CSL and the first control signal FRP, which are generated responsive to a clock signal CLK, are advanced compared to that of FIG. 3. One the other hand the buffered clock signals CLKDQF and CLKDQS and the second control signal SRP are delayed compared to that of FIG. 3. Therefore, there exists a time period T1 when the second pulse of the first control signal FRP and the first pulse of the second control signal SRP overlap. Therefore, the data SDOO1 and SDOE1, which are outputted responsive to the first pulse of the second control signal SRP, are not transmitted completely, but the data SDOO2 and SDOE2, which are outputted responsive to the first pulse of the second control signal SRP, are transmitted completely. Also, the data DQO1 generated responsive to the first pulse of the buffered clock signal CLKDQF is not transmitted completely, and the data DQE1 generated responsive to the first pulse of the buffered clock signal CLKDQS is not transmitted. Consequently, the order of the output data is changed, and the output data DQ2 is not generated, leading to a data read error. The origin of the data error is the overlap of the second pulse of the first control signal FRP and the first pulse of the second control signal SRP.

Figure 5:
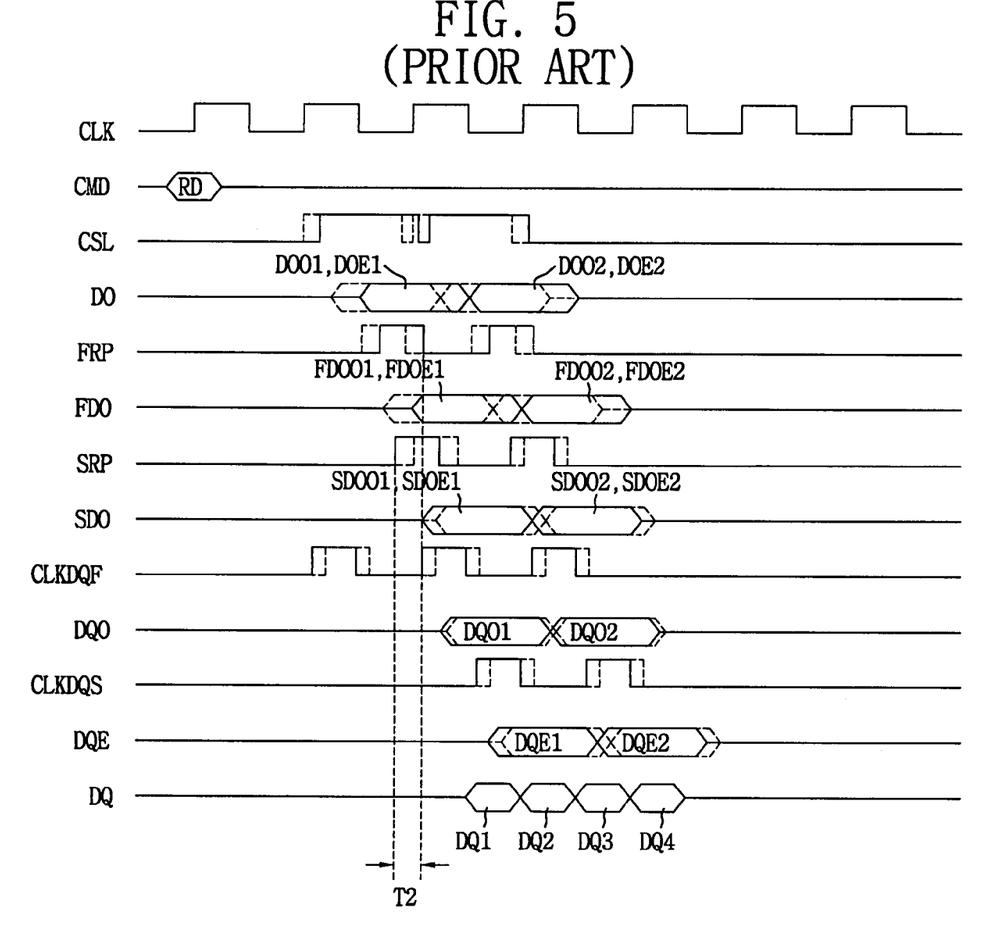
FIG. 5 is a timing diagram of a read operation of the semiconductor memory device of FIG. 1 operating under low power supply voltage and high temperature conditions.

FIG. 5 is a timing diagram illustrating a read operation of the semiconductor memory device of FIG. 1 operating under low power supply voltage and high temperature conditions. When a read command RD is applied, and a data is outputted to an external portion after 2.5 clock cycles with a burst length of 4. Dotted lines of FIG. 5 denote when signals of FIG. 3 are generated.

As shown in FIG. 5, when the semiconductor memory device operates under low power supply voltage and high temperature conditions, the column selecting signal CSL and the first control signal FRP, which are generated responsive to the external clock signal CLK, are delayed compared to that of FIG. 3. On the other hand, the buffered clock signals CLKDQF and CLKDQS and the second control signal SRP are advanced compared to that of FIG. 3. Therefore, there exists a time period T2 when the first pulse of the first control signal FRP and the first pulse of the second control signal SRP overlap.

However, in this case, responsive to the second control signal SRP, the data SDOO1 and SDOE1 and the data SDOO2 and SDOE2 are completely latched and then outputted, whereby the output data DQ1 to DQ4 are sequentially outputted.

As described above, the conventional DDR semiconductor memory device does not cause a data read error operating under normal conditions or low power supply voltage and high temperature conditions but does causes a data read error operating under high power supply voltage and low temperature conditions. This data read error occurs when an overlap occurs between the $(n+1)_{th}$ pulse of the first control signal FRP and the $n_{th}$ pulse of the second control signal SRP.

SUMMARY OF THE INVENTION

It is a feature of embodiments of the present invention to provide a semiconductor memory device that can prevent a data read error resulting from a variation of power supply voltage and temperature.

It is another feature of embodiments of the present invention to provide a data read method of a semiconductor memory device that can prevent a data read error resulting from a variation of power supply voltage and temperature.

The present invention provides a semiconductor memory device that includes a memory array with first and second memory banks. A first control signal generating circuit generates a first control signal responsive to an external clock. A first data output circuit transmits a first output data responsive to the first control signal. An internal clock signal generating circuit outputs first and second buffered clock signals responsive to the external clock. A second control signal generating circuit generates a second control signal responsive to the first buffered clock signal and the first control signal A second data output circuit transmits a second output data responsive to the second control signal. A third data output circuit transmits a third output data responsive to the first and second buffered clock signals.

The present invention further provides a data read method of a semiconductor memory device including generating a first control signal responsive to an external clock signal. The method transmits first data responsive to the first control signal and generates first and second buffered clock signals responsive to the external clock signal. The method generates a second control signal responsive to the first buffered clock signal and the first control signal and transmits second data responsive to the second control signal. And the method transmits third data responsive to the second buffered clock signal.

BRIEF DESCRIPTION OF THE DRAWINGS

The above and other features and advantages of the present invention will become more apparent to those of ordinary skill in the art by describing in detail preferred embodiments with reference to the attached drawings.

DETAILED DESCRIPTION OF THE INVENTION

The present invention will now be described more fully with reference to the accompanying drawings, in which preferred embodiments of the invention are shown. This invention may, however, be embodied in different forms and should not be construed as limited to the embodiments set forth here. Rather, these embodiments are provided so that this disclosure will be thorough and complete, and will fully convey the scope of the invention to those skilled in the art. Like numbers refer to like elements throughout the specification.

Figure 6:
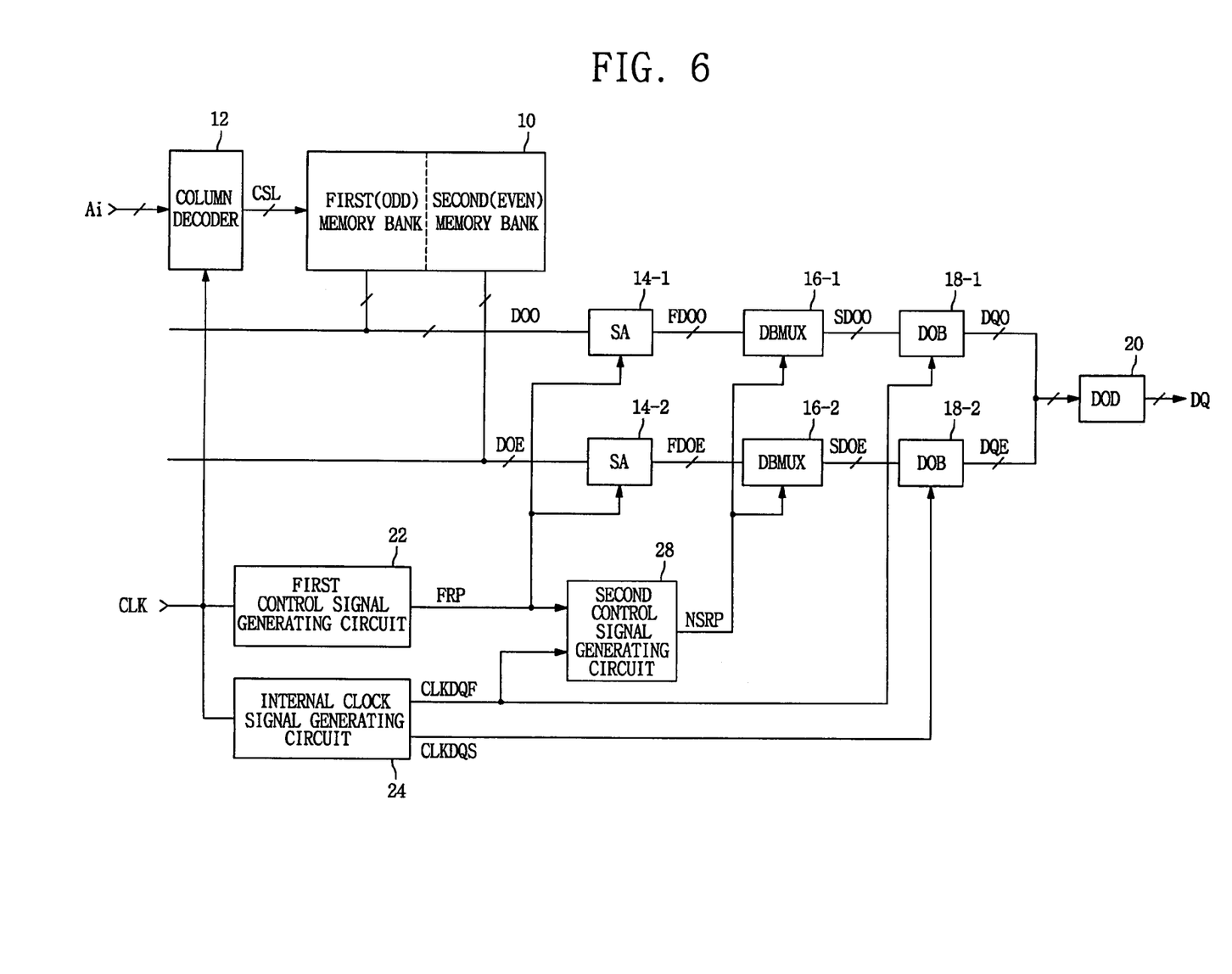
FIG. 6 is a block diagram of a DDR semiconductor memory device according to the present invention.

FIG. 6 is a block diagram of a DDR semiconductor memory device according to an embodiment of the present invention. The semiconductor memory device of FIG. 6 has the same configuration as that of FIG. 1 except that the second control signal generating circuit 26 of FIG. 1 is substituted with a second control signal generating circuit 28.

Like reference numerals of FIGS. 1 and 6 denote like parts and perform like operations, and thus function of the second control signal generating circuit 28 is explained below.

The second control signal generating circuit 28 receives the first control signal FRP and the buffered clock signal CLKDQF to generate a second control signal NSRP. The multiplexers 16-1 and 16-2 latch the data FDOO and FDOE to generate the data SDOO and SDOE, respectively, responsive to the second control signal NSRP.

Figure 7:
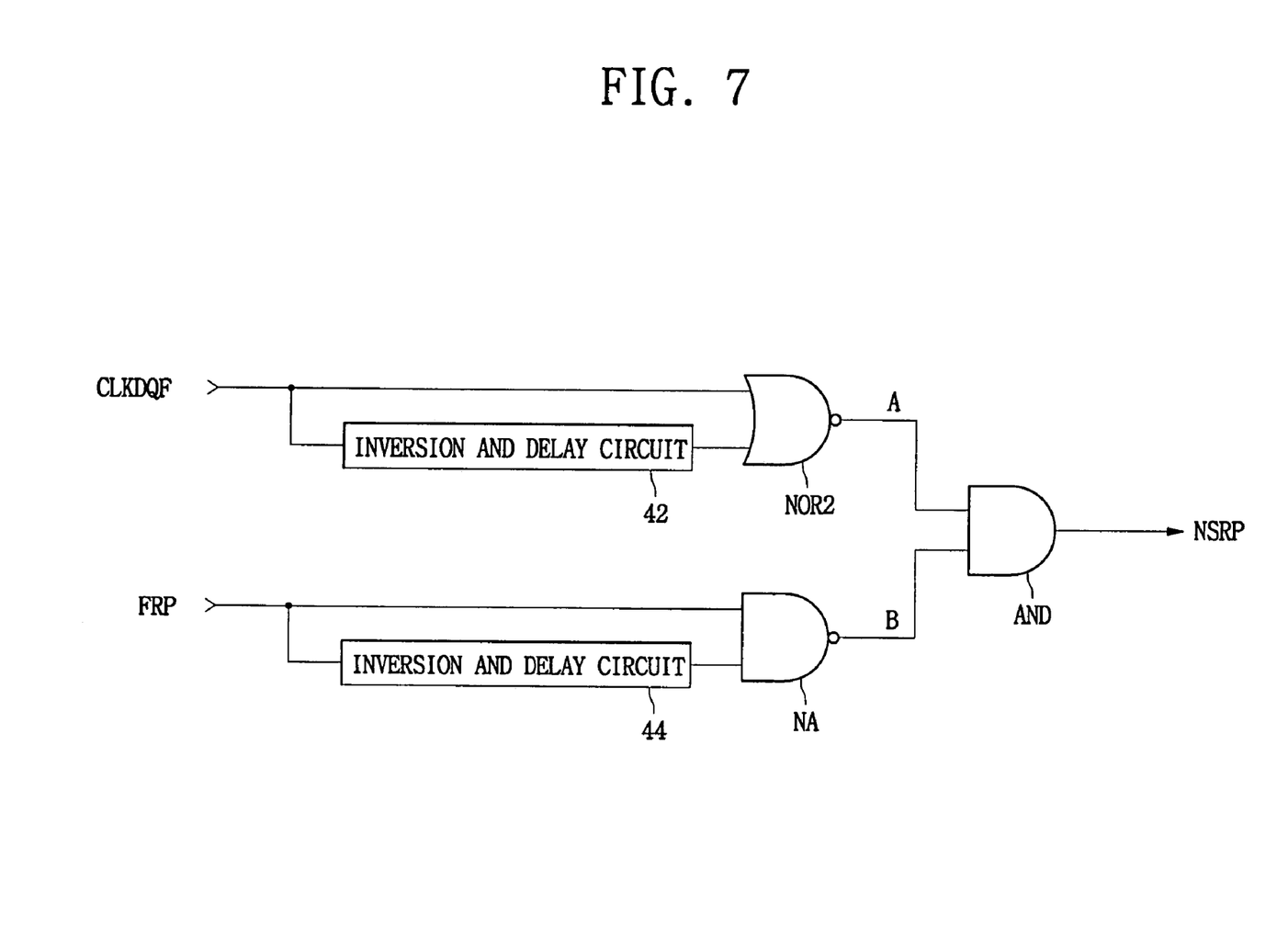
FIG. 7 is a schematic view of a second control signal generating circuit of the semiconductor memory device of FIG. 6.

FIG. 7 is a schematic view illustrating the second control signal generating circuit of the semiconductor memory device of FIG. 6. The second control signal generating circuit of FIG. 7 includes inversion and delay circuits 42 and 44, a NOR gate NOR2, a NAND gate NA, and an AND gate AND. The second control signal generating circuit of FIG. 7 operates as follows.

The inversion and delay circuit 42 inverts the buffered clock signal CLKDQF and delays it for a predetermined time period. The NOR gate NOR2 NORs an output signal of the inversion and delay circuit 42 and the buffered clock signal CLKDQF to generate a signal A. The inversion and delay circuit 44 inverts a first control signal FRP and delays it for a predetermined time period. The NAND gate NA NANDs the first control signal FRP and an output signal of the inversion and delay circuit 44 to generate a signal B. The AND gate AND ANDs the signals A and B to generate the second control signal NSRP.

The second control signal generating circuit of FIG. 7 generates the signal A having a pulse width set by the length of time the buffered clock signal CLKDQF is delayed by the invert and delay circuit 42 and is responsive to a falling transition of the buffered clock signal CLKDQF. The second control signal generating circuit generates the signal B having a pulse width set by the length of time the first control signal FRP is delayed by the invert and delay circuit 44 and is responsive to a rising transition of the first control signal FRP. The signals A and B are ANDed together to generate the second control signal NSRP. Consequently, the signal A is generated before the first control signal FRP, and the second control signal NSRP is generated by inactivating a portion of the signal A when the signal A overlaps the first control signal FRP.

Figure 8:
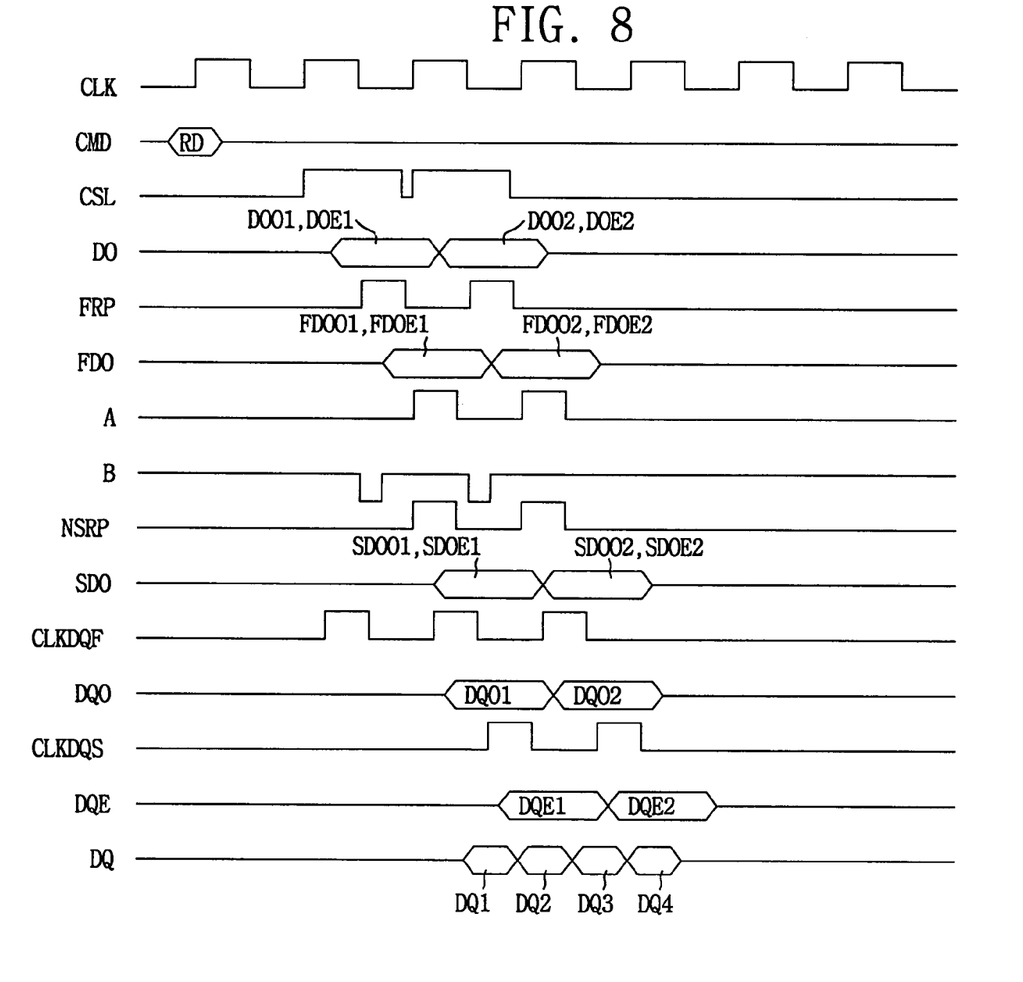
FIG. 8 is a timing diagram of a read operation of the semiconductor memory device of FIG. 6 operating under adequate power supply voltage and normal temperature conditions.

FIG. 8 is a timing diagram illustrating a read operation of the semiconductor memory device of FIG. 6 operating under adequate power supply voltage and room temperature conditions. When a read command RD is applied, a data is outputted to an external portion after 2.5 clock cycles with a burst length of 4.

In FIG. 8, the column selecting signal CSL, the first control signal FRP, and the buffered clock signals CLKDQF and CLKDQS are generated at the same time as those of FIG. 3. The signal A is generated at the same time as the second control signal SRP of FIG. 3. The signal B is a signal having a pulse width set by the length of time the first control signal FRP is delayed by the invert and delay circuit 44 and is generated responsive to a rising transition of the first control signal FRP. The second control signal NSRP is generated by ANDing the signals A and B.

Therefore, the semiconductor memory device of the present invention sequentially generates data DQ1 to DQ4 operating under adequate power supply voltage and normal temperature conditions. That is, a data read operation is stably performed.

Figure 9:
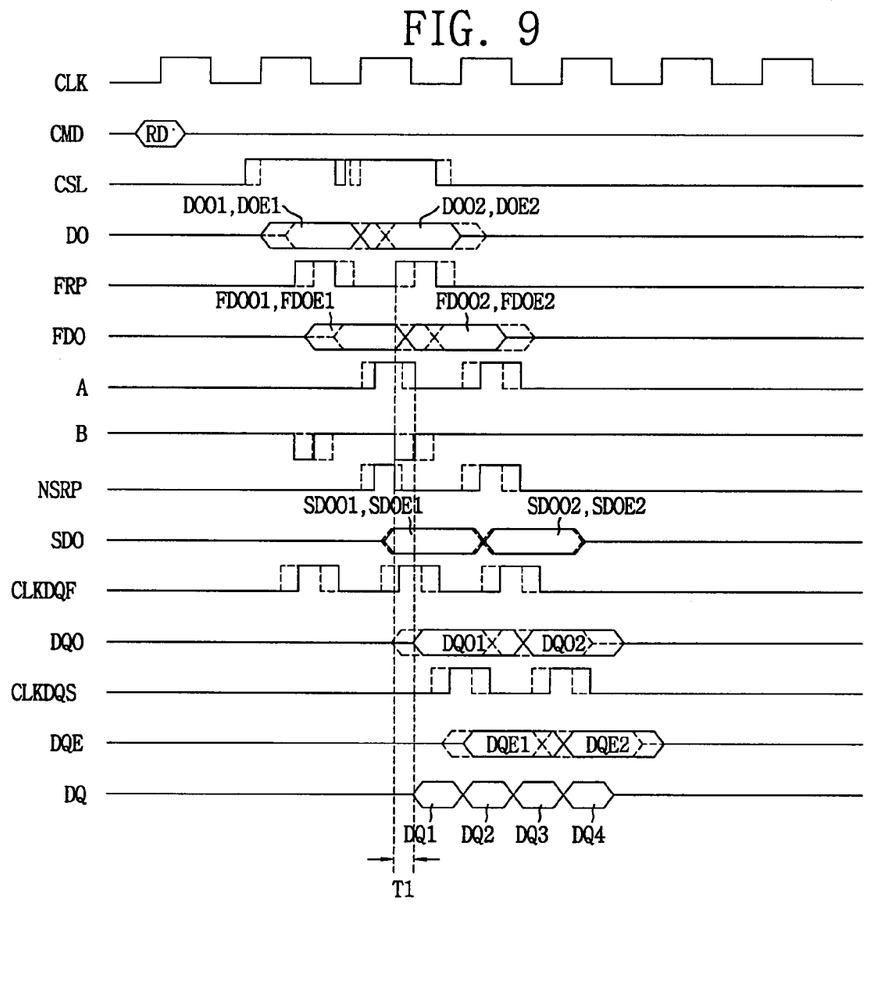
FIG. 9 is a timing diagram of a read operation of the semiconductor memory device of FIG. 6 operating under high power supply voltage and low temperature conditions.

FIG. 9 is a timing diagram illustrating a read operation of the semiconductor memory device of FIG. 6 operating under high power supply voltage and low temperature conditions. When a read command RD is applied, a data is outputted to an external portion after 2.5 clock cycles with a burst length of 4. Dotted lines of FIG. 9 denote when signals of FIG. 8 are generated.

In FIG. 9, the column selecting signal CSL, the first control signal FRP, and the buffered clock signals CLKDQF and CLKDQS are generated at the same time as those of FIG. 3. The signal A is generated at the same time as the second control signal SRP of FIG. 3. The signal B is a signal having a pulse width set the length of time the first control signal FRP is delayed by the invert and delay circuit 44 and is generated responsive to a rising transition of the first control signal FRP. The second control signal NSRP is generated by ANDing the signals A and B. Here, the second control signal NSRP is activated when the signal A is generated before the first control signal FRP and the signal A overlaps the first control signal FRP and is a signal that is activated only when both signal A and signal B are activated. That is, the second control signal NSRP is a modified version of the signal A in which the signal A is inactivated only when the signal A overlaps the first control signal FRP. Therefore, the multiplexers 16-1 and 16-2 sequentially latch the data FDOO1 and FDOE1 and the data FDOO2 and FDOE2 to stably generate the data SDOO1 and SDOE1 and the data SDOO2 and SDOE2, respectively, responsive to the second control signal NSRP. Thus, the data output buffers 18-1 and 18-2 sequentially buffer the data SDOO1 and SDOO2 and the data SDOE1 and SDOE2 to generate the data DQO1 and DQO2 and the data DQE1 and DQE2 responsive to the buffered clock signals CLKDQF and CLKDQS, respectively. The data output buffer 20 sequentially drives the data DQO1 and DQE1 and the data DQO2 and DQE2 to sequentially generate the output data DQ1 to DQ4.

The semiconductor memory device of the present invention generates correct output data unlike the conventional semiconductor memory device as shown in the timing diagram of FIG. 4.

That is, at high power supply voltage and low temperature conditions, the semiconductor memory device of the present invention generates an nth pulse of the signal A before an $(n+1)_{th}$ pulse of the first control signal FRP. A second control signal NSRP is generated by generating a modified version of the signal A in which the signal A is inactivated when the nth pulse of signal A overlaps the $(n+1)_{th}$ pulse of the first control signal FRP. This allows a stable read operation to be performed.

Figure 10:
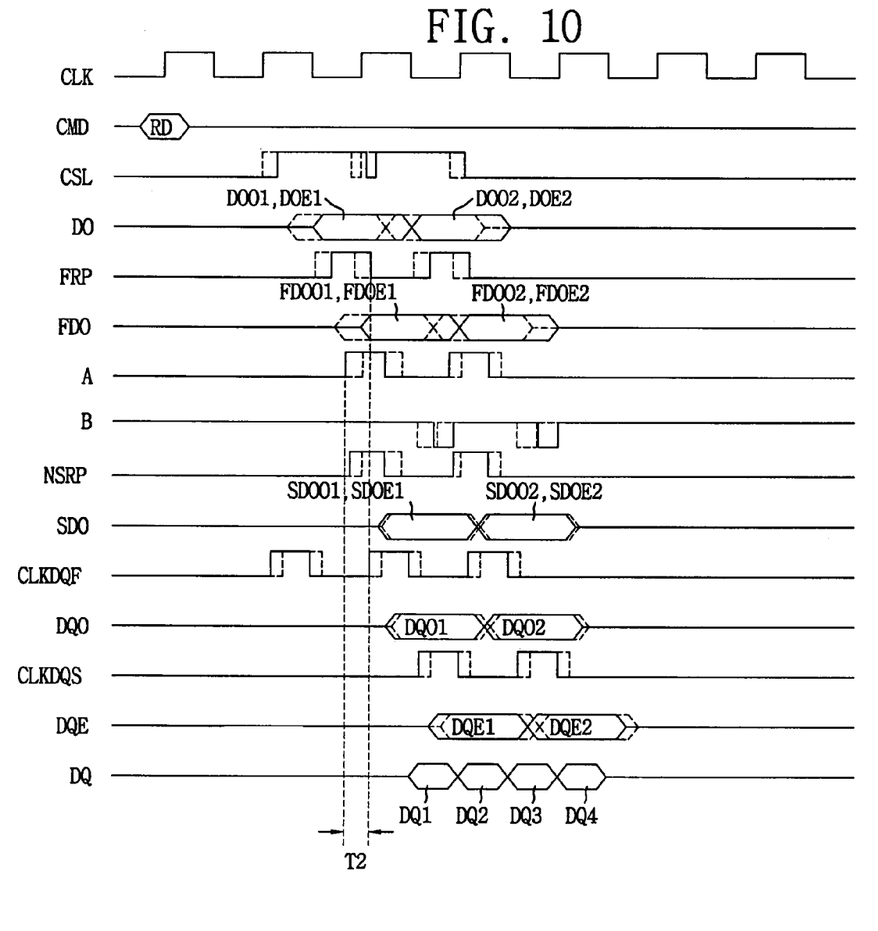
FIG. 10 is a timing diagram of a read operation of the semiconductor memory device of FIG. 6 operating under low power supply voltage and high temperature conditions.

FIG. 10 is a timing diagram of a read operation of the semiconductor memory device of FIG. 6 operating under low power supply voltage and high temperature conditions. When a read command RD is applied, a data is outputted to an external portion after 2.5 clock cycles with a burst length of 4. Dotted lines of FIG. 10 denote when signals of FIG. 8 are generated.

In FIG. 10, the column selecting signal CSL, the first control signal FRP, and the buffered clock signals CLKDQF and CLKDQS are generated at the same time as those of FIG. 5. The signal A is generated at the same time as the second control signal SRP of FIG. 3. The signal B is a signal having a pulse width set by the length of time the first control signal FRP is delayed by the invert and delay circuit 44 and is generated responsive to a rising transition of the first control signal FRP. The second control signal NSRP is generated by ANDing the signals A and B. Here, the second control signal NSRP is activated when the first control signal FRP is generated before the signal A and when the signal A overlaps the first control signal FRP, and is activated only when both the signal A and the signal B are activated. Thus, the output data DQ1 to DQ4 are sequentially stably outputted.

At low power supply voltage and high temperature, the semiconductor memory device of the present invention generates an exact output data even though there exists an overlap time period T2 when the nth pulse of the signal A overlaps the $(n+1)_{th}$ pulse of the first control signal FRP.

As described, the semiconductor memory device of embodiments of the present invention and the data read method according to embodiments of the present invention can perform a stable data read operation independent of variation in power supply voltage and temperature, thereby improving reliability.

We claim:

1. A semiconductor memory device, comprising:
   a memory array including first and second memory banks;
   a first control signal generating circuit to generate a first control signal responsive to an external clock;
   a first data output circuit to transmit a first output data responsive to the first control signal;
   an internal clock signal generating circuit to output first and second buffered clock signals responsive to the external clock;
   a second control signal generating circuit to generate a second control signal responsive to the first buffered clock signal and the first control signal;
   a second data output circuit to transmit a second output data responsive to the second control signal; and
   a third data output circuit to transmit a third output data responsive to the first and second buffered clock signals.

2. The semiconductor memory device of claim 1 where the semiconductor memory device operates at a double data rate.

3. The semiconductor memory device of claim 1 where the semiconductor memory device
   while operating at a high power supply voltage and low temperature generates the first control signal earlier and generates the second control signal and the first and second buffered clock signals later then when they would be generated operating under normal conditions; and
   while operating at a low power supply voltage and a high temperature generates the second control signal and the first and second buffered clock signals earlier and generates the first control signal later then when they would be generated operating under normal conditions.

4. The semiconductor memory device of claim 1 where the internal clock signal generating circuit includes a delay locked loop.

5. The semiconductor memory device of claim 1 where the internal clock signal generating circuit includes a phase locked loop.

6. The semiconductor memory device of claim 1 where the second control signal generating circuit comprises:
   a first signal generating circuit to generate a first signal responsive to the first buffered clock signal;
   a second signal generating circuit to generate a second signal responsive to the first control signal; and
   a third circuit to combine the first and the second signals to form the second control signal.

7. The semiconductor memory device of claim 1
   where the second control signal generating circuit operates responsive to the first buffered clock signal and the first control signal; and
      where the second control generating circuit generates a second control signal with each nth pulse being inactive when an (n+1)th pulse of the first control signal is active and when an (n+1)th pulse of the first control signal is generated after the nth pulse of the first buffered clock.

8. The semiconductor memory device of claim 1 where the second control signal generating circuit comprises:
   a circuit to NOR the first buffered clock signal with an inverted and delayed first buffered clock signal to form a first signal;
   a circuit to NAND the first control signal with an inverted and delayed first control signal to form a second signal; and a circuit to AND the first and the second signal to form the second control signal.

9. A method for reading data out of a semiconductor memory device, comprising:
generating a first control signal responsive to an external clock signal;
transmitting first data responsive to the first control signal;
generating first and second buffered clock signals responsive to the external clock signal;
generating a second control signal responsive to the first buffered clock signal and the first control signal;
transmitting second data responsive to the second control signal; and
transmitting third data responsive to the second buffered clock signal.

10. The method of claim 9 comprising operating at a double data rate.

11. The method of claim 9 comprising
generating the first control signal earlier and generates the second control signal and the first and second buffered clock signals later then when they would be generated operating under normal conditions while operating at a high power supply voltage and low temperature; and
generating the second control signal and the first and second buffered clock signals earlier and generates the first control signal later then when they would be generated operating under normal conditions while operating at a low power supply voltage and a high temperature.

12. The method of claim 9 where generating the first and second buffered clock signals is responsive to a variation of power supply voltage and temperature.

13. The method of claim 9 where generating the second control signal comprises:
generating a first signal responsive to the first buffered clock signal;
generating a second signal responsive to the first control signal; and
combining the first and second signal to form the second control signal.

14. The method of claim 9 where generating the second control signal comprises:
generating a first signal responsive to the first buffered clock; and
inactivating an nth pulse of the first signal when:
an (n+1)th pulse of the first control signal is active; and
the (n+1)th pulse of the first control signal is generated after the nth pulse of the first buffered clock.

15. The method of claim 9 where generating the second control signal comprises:
generating a first signal by NORing the first buffered clock signal with an inverted and delayed first buffered clock signal;
generating a second signal by NANDing the first control signal with an inverted and delayed first control signal; and
forming the second control signal by ANDing the first and second signals.

* * * * *